(12) United States Patent
Hitomi et al.

(10) Patent No.: US 10,971,459 B2
(45) Date of Patent: Apr. 6, 2021

(54) HIGH-FREQUENCY MODULE

(71) Applicant: Murata Manufacturing Co., Ltd., Kyoto (JP)

(72) Inventors: Shinya Hitomi, Kyoto (JP); Hidenori Obiya, Kyoto (JP); Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 101 days.

(21) Appl. No.: 15/905,104

(22) Filed: Feb. 26, 2018

(65) Prior Publication Data

US 2018/0190601 A1 Jul. 5, 2018

Related U.S. Application Data

(63) Continuation of application No. PCT/JP2016/069227, filed on Jun. 29, 2016.

(30) Foreign Application Priority Data

Aug. 27, 2015 (JP) .............................. JP2015-168089

(51) Int. Cl.
*H01L 23/66* (2006.01)
*H04B 1/38* (2015.01)
(Continued)

(52) U.S. Cl.
CPC .............. *H01L 23/66* (2013.01); *H01L 23/04* (2013.01); *H01L 23/055* (2013.01); *H01L 23/10* (2013.01);
(Continued)

(58) Field of Classification Search
None
See application file for complete search history.

(56) References Cited

U.S. PATENT DOCUMENTS 5,774,344 A * 6/1998 Casebolt .............. H05K 9/0037
174/51
2008/0067656 A1 * 3/2008 Leung ................. H01L 23/5385
257/686

(Continued)

FOREIGN PATENT DOCUMENTS

JP    S63-77198 A    4/1988
JP    2001-177346 A    6/2001
(Continued)

OTHER PUBLICATIONS

JP2001177346 Makoto et al (Year: 2001).*
(Continued)

*Primary Examiner* — Jianxun Yang
(74) *Attorney, Agent, or Firm* — Pearne & Gordon LLP (57) ABSTRACT

A high-frequency module (1) includes a first substrate (101), a second substrate (102) that faces the first substrate (101), a support (103) that supports the first substrate (101) and the second substrate (102), and a plurality of high-frequency circuit components arranged in internal space formed by the first substrate (101), the second substrate (102), and the support and on both of facing principal faces of the first substrate (101) and the second substrate (102), and the plurality of high-frequency circuit components include a power amplifier element that constitutes a power amplifier circuit (16).

19 Claims, 7 Drawing Sheets

(51) Int. Cl.
*H04B 1/04* (2006.01)
*H04B 1/18* (2006.01)
*H03F 3/24* (2006.01)
*H01L 23/055* (2006.01)
*H01L 23/16* (2006.01)
*H01L 23/04* (2006.01)
*H01L 23/10* (2006.01)
*H01L 23/538* (2006.01)
*H01L 23/552* (2006.01)
*H01L 25/16* (2006.01)
*H03F 3/195* (2006.01)
*H03F 3/21* (2006.01)
*H03F 3/213* (2006.01)
*H03H 9/05* (2006.01)
*H01L 23/00* (2006.01)
*H03H 7/38* (2006.01)

(52) U.S. Cl.
CPC .......... *H01L 23/16* (2013.01); *H01L 23/5386* (2013.01); *H01L 23/552* (2013.01); *H01L 25/162* (2013.01); *H01L 25/165* (2013.01); *H03F 3/195* (2013.01); *H03F 3/211* (2013.01); *H03F 3/213* (2013.01); *H03F 3/245* (2013.01); *H04B 1/0458* (2013.01); *H04B 1/18* (2013.01); *H04B 1/38* (2013.01); *H01L 24/05* (2013.01); *H01L 24/16* (2013.01); *H01L 24/48* (2013.01); *H01L 24/49* (2013.01); *H01L 2223/6655* (2013.01); *H01L 2223/6677* (2013.01); *H01L 2224/05553* (2013.01); *H01L 2224/16225* (2013.01); *H01L 2224/16227* (2013.01); *H01L 2224/48227* (2013.01); *H01L 2224/49111* (2013.01); *H01L 2224/49175* (2013.01); *H01L 2924/00014* (2013.01); *H01L 2924/1421* (2013.01); *H01L 2924/14215* (2013.01); *H01L 2924/15311* (2013.01); *H01L 2924/19041* (2013.01); *H01L 2924/19042* (2013.01); *H01L 2924/19105* (2013.01); *H01L 2924/3025* (2013.01); *H03F 2200/111* (2013.01); *H03F 2200/168* (2013.01); *H03F 2200/222* (2013.01); *H03F 2200/294* (2013.01); *H03F 2200/411* (2013.01); *H03F 2200/451* (2013.01); *H03F 2203/21103* (2013.01); *H03F 2203/21112* (2013.01); *H03F 2203/21157* (2013.01); *H03H 7/38* (2013.01); *H03H 9/0542* (2013.01); *H03H 9/0547* (2013.01)

(56) References Cited

U.S. PATENT DOCUMENTS

| | | |
|---|---|---|
| 2012/0001809 A1 | 1/2012 | Peng et al. |
| 2013/0122833 A1 | 5/2013 | Hadjichristos et al. |
| 2013/0176913 A1* | 7/2013 | Niskanen ............ H04B 1/48 370/278 |
| 2014/0157864 A1 | 6/2014 | Sundal et al. |
| 2014/0252568 A1* | 9/2014 | Hwang ............... H01L 23/552 257/659 |
| 2015/0171955 A1* | 6/2015 | Olesen ............... H04B 7/265 370/252 |

FOREIGN PATENT DOCUMENTS

| | | |
|---|---|---|
| JP | 2003-249868 A | 9/2003 |
| JP | 2012-520584 A | 9/2012 |
| JP | 2014-533911 A | 12/2014 |

OTHER PUBLICATIONS

JPS6377198 Makoto et al (Year: 1988).*
International Search Report for International Application No. PCT/JP2016/069227 dated Aug. 9, 2016.
Written Opinion for International Application No. PCT/JP2016/069227 dated Aug. 9, 2016.

* cited by examiner

FIG. 10

HIGH-FREQUENCY MODULE

This is a continuation of International Application No. PCT/JP2016/069227 filed on Jun. 29, 2016 which claims priority from Japanese Patent Application No. 2015-168089 filed on Aug. 27, 2015. The contents of these applications are incorporated herein by reference in their entireties.

BACKGROUND OF THE DISCLOSURE

Field of the Disclosure

The present disclosure relates to high-frequency modules that process high-frequency signals.

Description of the Related Art

Demands for downsizing and reduction in profile in a front end portion of a radio communication terminal, which is typified by a cellular phone, have been increasing.

Patent Document 1 discloses a configuration of a radio frequency package on package (PoP) circuit. To be ready for transition to multibands and multimodes, the radio frequency PoP circuit includes a first radio frequency package with a passive radio frequency component and a second radio frequency package with an active radio frequency component. The first radio frequency package and the second radio frequency package are laminated in a vertical configuration. Thus, the area of the front end portion can be reduced.

Patent Document 1: Japanese Unexamined Patent Application Publication (Translation of PCT Application) No. 2014-533911

BRIEF SUMMARY OF THE DISCLOSURE

In the conventional techniques disclosed in Patent Document 1, high-frequency circuit components are also arranged on a substrate of the first radio frequency package arranged to be laminated on the upper side and thus, when the first radio frequency package and the second radio frequency package are laminated, upsizing or increase in profile occurs by an amount of the high-frequency circuit components arranged on the substrate of the first radio frequency package.

When a high-frequency amplifier element including a low noise amplifier (LNA) and a power amplifier (PA) is further arranged on the substrate of the first radio frequency package arranged to be laminated on the upper side, in addition to the above-described problem, effect of unwanted radiation in an outer side portion of shielded space surrounded by the substrate of the first radio frequency package and the substrate of the second radio frequency package can decrease performance of a high-frequency amplifier element that is present outside the shielded space and arranged on the substrate of the first radio frequency package.

The present disclosure has been made to solve such problems and is aimed at providing a high-frequency module that can ensure performance of a high-frequency amplifier element while enabling downsizing or reduction in profile.

To achieve the above-described aim, a high-frequency module according to an aspect of the present disclosure includes: a first substrate; a second substrate that faces the first substrate; a support that supports the first substrate and the second substrate; and a plurality of high-frequency circuit components arranged in internal space formed by the first substrate, the second substrate, and the support and on both of facing principal faces of the first substrate and the second substrate, the plurality of high-frequency circuit components including a high-frequency amplifier element that constitutes a high-frequency amplifier circuit.

According to the aspect, the plurality of high-frequency circuit components are arranged in the internal space formed by the first substrate and the second substrate, which are in a lamination relation, and the support and on both of facing principal faces of the first substrate and the second substrate. Consequently, components outside the package can be reduced and accordingly, downsizing or reduction in profile is enabled. In addition, since the high-frequency amplifier element is arranged in the internal space formed by the substrates and the support, the protection from unwanted radiation outside is enabled. As a result, a high-frequency module that can ensure performance of a high-frequency amplifier element while enabling downsizing or reduction in profile can be provided.

On the principal face of the substrate that is one of the first substrate and the second substrate and faces the other substrate on which the high-frequency amplifier circuit is arranged and in a region that overlaps the high-frequency amplifier circuit when the first substrate and the second substrate are seen in a plan view, none of the plurality of high-frequency circuit components may be arranged.

In a region that overlaps an output unit of the high-frequency amplifier circuit when the first substrate and the second substrate are seen in a plan view, none of the plurality of high-frequency circuit components may be arranged.

Thus, degradation in characteristics of the high-frequency circuit components other than the power amplifier element because of unwanted radiation from the power amplifier element that outputs large power can be inhibited.

A conductor layer arranged on the principal face of the substrate that is one of the first substrate and the second substrate and faces the other substrate on which the high-frequency amplifier circuit is arranged and in a region that overlaps the output unit of the high-frequency amplifier circuit in the plan view may further be included.

Thus, effect of unwanted radiation from the output unit of the high-frequency amplifier element on the opposite substrate can be inhibited.

A principal ingredient of the conductor layer may be identical to a material of a wiring layer that constitutes a wiring structure of the first substrate or the second substrate.

Thus, the conductor layer and a wiring pattern of a substrate can be formed in an identical process and as a result, simplification of manufacturing processes and reduction in costs are enabled.

A conductor member that is in contact with the principal face of the first substrate and the principal face of the second substrate and is arranged between the high-frequency amplifier circuit and a high-frequency circuit component adjacent to the high-frequency amplifier circuit when the first substrate and the second substrate are seen in a plan view may further be included.

Thus, the conductor member is arranged in the hollow portion while being in contact with the first substrate and the second substrate and accordingly, has a function as reinforcement for ensuring the hollow portion. Consequently, the hollow structure is unlikely to be broken. In addition, arranging the conductor member between the high-frequency amplifier element and another high-frequency circuit component can prevent diffusion of unwanted radiation in a lateral direction.

The conductor member may be the plurality of high-frequency circuit components.

Since for example, a high-frequency circuit component (including a ground electrode terminal of a high-frequency circuit component), such as a capacitor, can be constituted using the conductor member, extra arrangement of a high-frequency circuit component is unnecessary. As a result, downsizing is enabled.

A plurality of the conductor members may be arranged at predetermined intervals along an outer edge of the high-frequency amplifier circuit in the plan view, and the predetermined interval may be less than or equal to $\lambda/4$, where $\lambda$ represents a wave length of a high-frequency signal output from the high-frequency amplifier circuit.

Thus, electromagnetic radiation from the high-frequency amplifier element can be completely confined and entry of unwanted radiation from the outside can also be inhibited.

The high-frequency amplifier circuit may be surrounded by an electric conductor including the conductor member when the first substrate and the second substrate are seen in a cross-sectional view, and the electric conductor may be coupled to a ground.

Thus, the high-frequency amplifier element is surrounded by the electric conductor and accordingly, diffusion of unwanted radiation from the high-frequency amplifier element can be prevented. In addition, coupling to the ground can release the unwanted radiation to the outside. Moreover, entry of unwanted radiation from the outside can be prevented.

The plurality of high-frequency circuit components may include a high-frequency amplifier module constituted of a plurality of the high-frequency amplifier elements and an inter-stage filter circuit that is arranged on a coupling path of the plurality of high-frequency amplifier elements.

The plurality of high-frequency amplifier elements that constitute the high-frequency amplifier module may be all arranged on the principal face of one of the first substrate and the second substrate, and the inter-stage filter circuit that constitutes the high-frequency amplifier module may be arranged on the principal face of the other of the first substrate and the second substrate.

Thus, a distance between the high-frequency amplifier element and the inter-stage filter circuit can be ensured and accordingly, entry of unwanted electromagnetic radiation of the high-frequency amplifier element into the inter-stage filter circuit can be inhibited. Consequently, degradation in characteristics can be prevented while enabling downsizing and reduction in profile of the amplifier module.

The inter-stage filter circuit may be a filter circuit that attenuates a reception frequency band.

Thus, when transmission signal components amplified by the high-frequency amplifier element include a signal in a reception frequency band, the signal in the reception frequency band can be attenuated through the inter-stage filter circuit and a transmission signal can be prevented from sneaking to a reception circuit.

The inter-stage filter circuit may be a filter circuit that attenuates a frequency band of a TV idle channel other than a channel being used among TV idle channels, or/and IMD noise.

The inter-stage filter circuit may be a filter circuit that attenuates the frequency band of a TV idle channel other than the channel being used among TV idle channels, or/and intermodulation distortion (IMD) noise. With such a configuration, the frequency of a channel adjacent to the channel used can be attenuated in a system that utilizes an idle channel in TV channels for another communication and thus, an idle channel in TV channels can be effectively utilized.

The high-frequency amplifier element may be a power amplifier that amplifies a transmission wave.

Since the power amplifier that outputs large power is arranged in the hollow portion, the power amplifier can be protected from unwanted radiation that enters from the outside and entry of unwanted radiation from the power amplifier into a circuit component close to the front end portion can be inhibited.

The high-frequency module according to the present disclosure enables downsizing and reduction in profile while ensuring performance of a high-frequency circuit component.

DETAILED DESCRIPTION OF THE DISCLOSURE

Embodiments of the present disclosure are described in detail below by referring to the embodiments and drawings thereof. All the embodiments described below represent comprehensive or specific examples. The values, shapes, materials, constituent elements, arrangements and coupling forms of the constituent elements, and the like mentioned in the embodiments below are examples and are not intended to limit the present disclosure. Among the constituent elements in the embodiments below, the constituent elements that are not recited in independent claims are described as being given constituent elements. The sizes or size ratios of the constituent elements illustrated in the drawings are not necessarily precise.

First Embodiment

[1.1 Circuit Configuration of High-Frequency Module]

Figure 1:
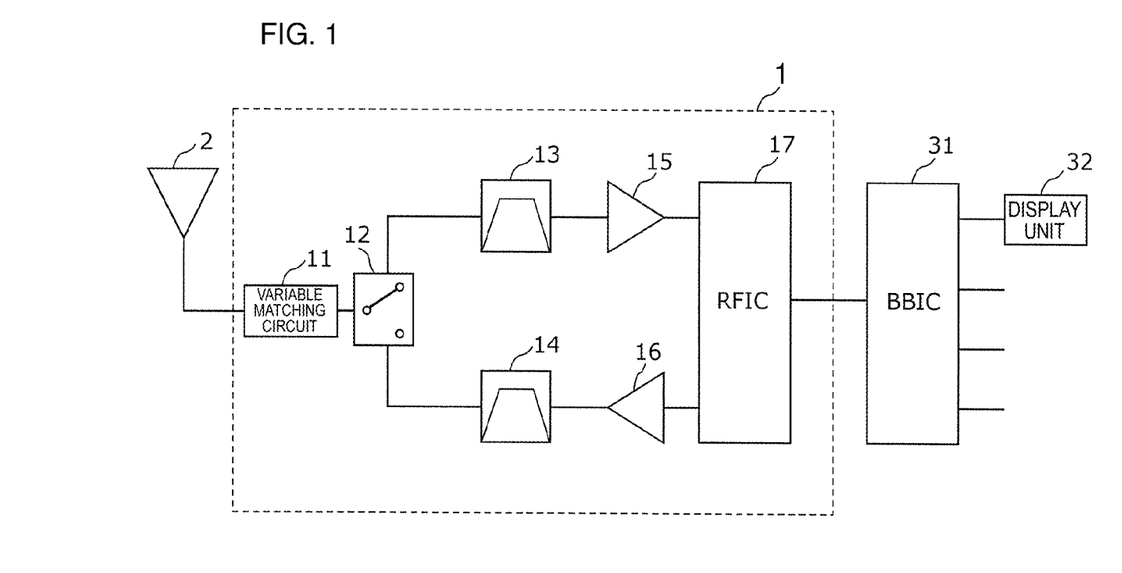
FIG. 1 illustrates an example of a circuit configuration of a high-frequency module and peripheral circuits according to a first embodiment.

FIG. 1 illustrates an example of a circuit configuration of a high-frequency module 1 and peripheral circuits according to a first embodiment. In FIG. 1, the high-frequency module 1, an antenna element 2, a base band signal processing circuit 31, and a display unit 32 according to the first embodiment are depicted. The high-frequency module 1, the antenna element 2, the base band signal processing circuit 31, and the display unit 32 are arranged in for example, a front end portion of a multimode/multiband-compatible cellular phone.

The high-frequency module 1 includes a variable matching circuit 11, an antenna switch 12, a reception-side filter 13, a transmission-side filter 14, a low noise amplifier circuit 15, a power amplifier circuit 16, and an RF signal processing circuit 17.

The variable matching circuit 11 is coupled to the antenna element 2 and the antenna switch 12, and can vary a circuit state according to a band and a mode that are selected. Thus, the high-frequency module 1 enables impedance matching with the antenna element 2 even when the selected band and mode are changed. The variable matching circuit 11 is constituted of one or more high-frequency circuit components and is made up of for example, a chip-like inductor and a chip-like variable capacitor. The variable matching circuit 11 is no indispensable constituent element of the high-frequency module 1. Depending on a demanded system, the variable matching circuit 11 may be a fixed matching circuit.

The antenna switch 12 is a high-frequency circuit component that switches coupling between the antenna element 2 and a plurality of signal paths by coupling the antenna element 2 (and the variable matching circuit 11) to one of a transmission-side signal path and a reception-side signal path. More specifically, the antenna switch 12 includes an input terminal coupled to the variable matching circuit 11 and an output terminal coupled to the transmission-side signal path or the reception-side signal path. That is, in the present embodiment, the antenna switch 12 constitutes a one-input two-output type high-frequency switch. The antenna switch 12 is not limited to the one-input two-output type. The antenna switch 12 may be omitted. Instead of the antenna switch 12, a duplexer may be arranged.

The reception-side filter 13 is a high-frequency circuit component to which a reception wave received at the antenna element 2 is input through the antenna switch 12 and that performs filtering in a predetermined transmission pass band on the reception wave to output the resultant reception wave to the low noise amplifier circuit 15. Examples of the reception-side filter 13 include an elastic surface acoustic wave filter, an elastic boundary acoustic wave filter, an elastic wave filter that uses a bulk acoustic wave (BAW), and an LC filter that is constituted of an inductance element and a capacitor element.

The transmission-side filter 14 is a high-frequency circuit component that performs filtering in a predetermined transmission pass band on a transmission wave output from the power amplifier circuit 16 to output the resultant transmission wave to the antenna switch 12. Examples of the transmission-side filter 14 include an elastic surface acoustic wave filter, an elastic boundary acoustic wave filter, an elastic wave filter that uses a BAW, and an LC filter that is constituted of an inductance element and a capacitor element. The transmission-side filter 14 may be omitted.

The low noise amplifier circuit 15 is a high-frequency amplifier circuit that amplifies a reception wave output from the reception-side filter 13 and outputs the resultant reception wave to the RF signal processing circuit 17.

The power amplifier circuit 16 is a high-frequency amplifier circuit that amplifies a transmission wave output from the RF signal processing circuit 17 and outputs the resultant transmission wave to the transmission-side filter 14. The power amplifier circuit 16 includes a high-frequency amplifier element and a matching circuit.

The RF signal processing circuit 17 is a high-frequency circuit component that performs signal processing on a reception wave inputted from the antenna element 2 through the reception-side signal path by downconversion or the like and outputs a transmission signal generated as a result of the signal processing to the base band signal processing circuit 31. Also, the RF signal processing circuit 17 is a high-frequency circuit component that performs signal processing on a transmission signal inputted from the base band signal processing circuit 31 by upconversion and outputs a transmission wave generated as a result of the signal processing to the low noise amplifier circuit 15.

The base band signal processing circuit 31 performs signal processing using an intermediate frequency band lower in frequency than that of a high-frequency signal in the front end portion. An image signal processed in the base band signal processing circuit 31 is for example, used for image display on the display unit 32 and an audio signal processed in the base band signal processing circuit 31 is for example, used for a conversation through a speaker.

[1.2 Structure of High-Frequency Module According to First Embodiment]

Figure 2:
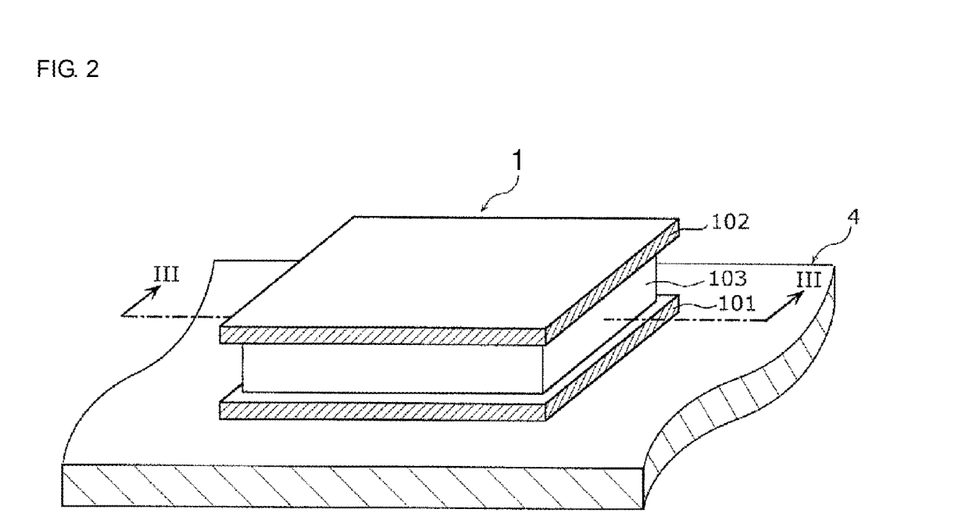
FIG. 2 is a perspective view that illustrates an external appearance of the high-frequency module according to the first embodiment.
Figure 3:
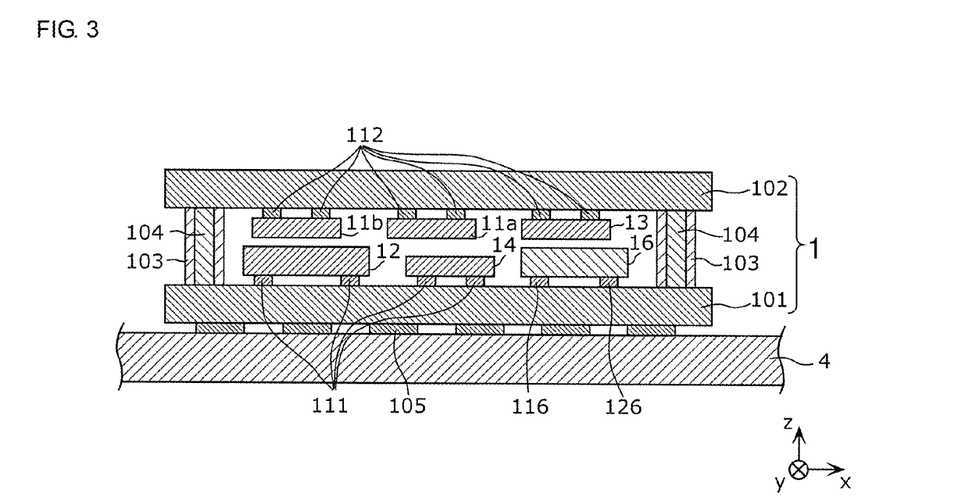
FIG. 3 is a cross-sectional structural view of the high-frequency module according to the first embodiment.

A structure of the high-frequency module 1 according to the present embodiment is described by referring to FIGS. 2 and 3.

FIG. 2 is a perspective view that illustrates an external appearance of the high-frequency module 1 according to the first embodiment. FIG. 3 is a cross-sectional structural view of the high-frequency module 1 according to the first embodiment. In each of FIGS. 2 and 3, the external appearance and cross-sectional structure of the high-frequency module 1 in a state where the high-frequency module 1 is mounted on a mounting board 4 are depicted. FIG. 3 is a III-III cross-sectional view of the high-frequency module 1 in FIG. 2.

In the high-frequency module 1 according to the present embodiment, as illustrated in FIG. 2, high-frequency circuit components, not illustrated in FIG. 2, are mounted inside a package body constituted of a first substrate 101, a second substrate 102, and a support 103. The high-frequency module 1 includes the first substrate 101, the second substrate 102, the support 103, variable matching elements 11a and 11b, the antenna switch 12, the reception-side filter 13, the transmission-side filter 14, the power amplifier circuit 16, and the RF signal processing circuit 17.

The first substrate 101 has a wiring structure and on a first principal face (the front side) of the first substrate 101, which faces the second substrate 102, electrode wiring patterns 111, 116, and 126 for electrical coupling with each high-frequency circuit component and columnar electrodes 104 are formed and on a second principal face (the back side) of the first substrate 101, an electrode wiring pattern 105 for electrical coupling with the mounting board 4 is formed. Further, on the first substrate 101, coupling conductors (via hole electrodes), which electrically couple the electrode wiring patterns formed on the first principal face and the electrode wiring pattern formed on the second principal face, are arranged although not illustrated. The first substrate 101 constitutes a package bottom plate portion of the high-frequency module 1.

The second substrate 102 has a wiring structure and is arranged so as to face the first substrate 101 and on a first principal face (the front side) of the second substrate 102, which faces the first substrate 101, an electrode wiring pattern 112 for electrical coupling with each high-frequency circuit component and the columnar electrodes 104 is formed. The second substrate 102 constitutes a package top plate portion of the high-frequency module 1.

The first substrate 101 and the second substrate 102 may constitute a multilayer substrate. In this case, complicated wiring patterns may be formed in the substrate.

As the first substrate 101 and the second substrate 102, a ceramic substrate, a glass epoxy substrate, or a flexible substrate can be used for example.

The support 103 is a member that is coupled to the first substrate 101 and the second substrate 102 and serves to fix the first substrate 101 and the second substrate 102 to each other, and constitutes a package side wall portion of the high-frequency module 1.

The first substrate 101, the second substrate 102, and the support 103 form a hollow portion of the high-frequency module 1. The support 103 does not need to be a continuous rectangular cylindrical member that connects the first substrate 101 and the second substrate 102 and may be a collection of a plurality of wall members that are discretely arranged along the outer edges of the first substrate 101 and the second substrate 102. That is, internal space formed by the first substrate 101, the second substrate 102, and the support 103 does not need to be closed space and may include a portion that allows the internal space and external space to communicate.

A material of the support 103 is not particularly limited and is for example, ceramic, polyimide, or epoxy.

Inside the support 103, the columnar electrodes 104 coupled to the electrode wiring patterns of both the first substrate 101 and the second substrate 102 are formed. The columnar electrodes 104 are discretely arranged along the outer edges of the first substrate 101 and the second substrate 102 or in the internal space surrounded by the first substrate 101, the second substrate 102, and the support 103. This arrangement enables the high-frequency circuit components arranged on the first principal face of the second substrate 102 to have continuity with the first substrate 101 and the mounting board 4.

Examples of materials of the columnar electrode 104, the electrode wiring patterns formed on the first substrate 101 and the second substrate 102, and the via hole electrode include gold, copper, and an alloy thereof.

The variable matching elements 11a and 11b, the antenna switch 12, the reception-side filter 13, the transmission-side filter 14, and the power amplifier circuit 16 are arranged in the hollow portion formed by the first substrate 101, the second substrate 102, and the support 103 and on one of the first principal face of the first substrate 101 and the first principal face of the second substrate 102. More specifically, the antenna switch 12, the transmission-side filter 14, and the power amplifier circuit 16 are arranged on the first principal face of the first substrate 101 while the variable matching elements 11a and 11b and the reception-side filter 13 are arranged on the first principal face of the second substrate 102. An input terminal of the power amplifier circuit 16 is coupled to the electrode wiring pattern 116 and an output terminal of the power amplifier circuit 16 is coupled to the electrode wiring pattern 126. The respective terminals of the antenna switch 12 and the transmission-side filter 14 are each coupled to the electrode wiring pattern 111. The respective terminals of the variable matching elements 11a and 11b and the reception-side filter 13 are each coupled to the electrode wiring pattern 112.

The electrode wiring pattern 105 formed on the second principal face of the first substrate 101 is coupled to electrodes provided on the mounting board 4.

On each of the first principal face of the first substrate 101 and the first principal face of the second substrate 102, at least one of the plurality of high-frequency circuit components is arranged. On the first principal face of the first substrate 101, the power amplifier circuit 16, which is a high-frequency amplifier circuit, is arranged.

In the above-described configuration, the high-frequency module 1 is downsized since the substrates on which the high-frequency circuit components are mounted are laminated in a direction perpendicular to the circuit mounting faces.

The plurality of high-frequency circuit components are separately arranged on the first substrate 101 and the second substrate 102 in a lamination relation and the plurality of high-frequency circuit components arranged on the two substrates are arranged in a single continuous internal space without being divided by a package member. Consequently, the front end portion can be downsized and reduced in profile. In addition, since the power amplifier circuit 16, which has the largest effect on noise performance of a high-frequency signal, is arranged in the internal space surrounded by the first substrate 101, the second substrate 102, and the support 103, the protection from unwanted radiation that enters from the outside is enabled. As a result, while ensuring performance of the high-frequency circuit components that constitute the front end portion, the high-frequency module 1 downsized and reduced in profile can be provided.

Although the power amplifier circuit 16 is taken as the high-frequency amplifier circuit, the high-frequency amplifier circuit according to the present embodiment may be the low noise amplifier circuit 15. Both of the power amplifier circuit 16 and the low noise amplifier circuit 15 may be installed in the internal space. The power amplifier circuit 16 may be arranged on the first principal face of the second substrate 102 instead of being arranged on the first principal face of the first substrate 101.

[1.3 Structure of High-Frequency Module According to First Variation]

Figure 4:
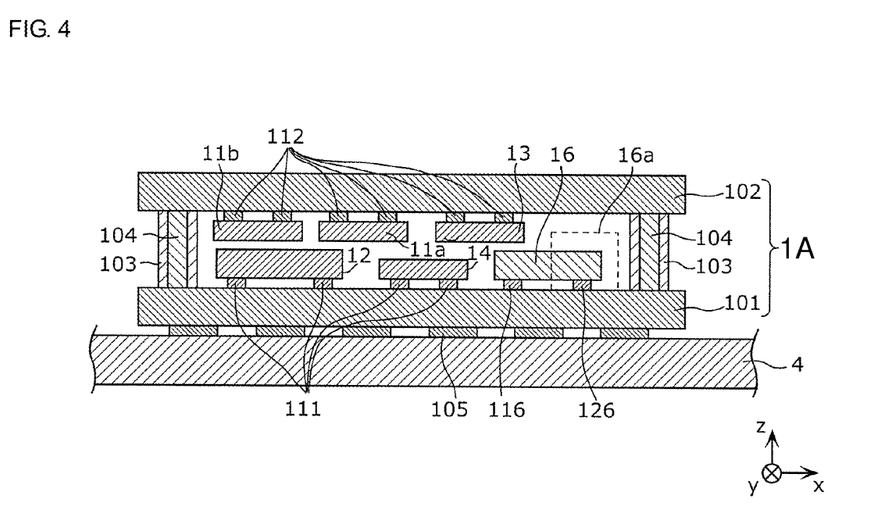
FIG. 4 is a cross-sectional structural view of a high-frequency module according to a first variation of the first embodiment.

FIG. 4 is a cross-sectional structural view of a high-frequency module 1A according to a first variation of the first embodiment. The high-frequency module 1A illustrated in FIG. 4 is different from the high-frequency module 1 according to the first embodiment in the arrangement of the high-frequency circuit components on the first principal face of the second substrate 102. Regarding the high-frequency module 1A according to the present variation, descriptions of the points common to the high-frequency module 1 are omitted and different points are mainly described below.

The variable matching elements 11a and 11b, the antenna switch 12, the reception-side filter 13, the transmission-side filter 14, and the power amplifier circuit 16 are arranged in the hollow portion formed by the first substrate 101, the second substrate 102, and the support 103 and on one of the first principal face of the first substrate 101 and the first principal face of the second substrate 102. In the present embodiment, the antenna switch 12, the transmission-side filter 14, and the power amplifier circuit 16 are arranged on the first principal face of the first substrate 101 while the variable matching elements 11a and 11b and the reception-side filter 13 are arranged on the first principal face of the second substrate 102.

Figure 8:
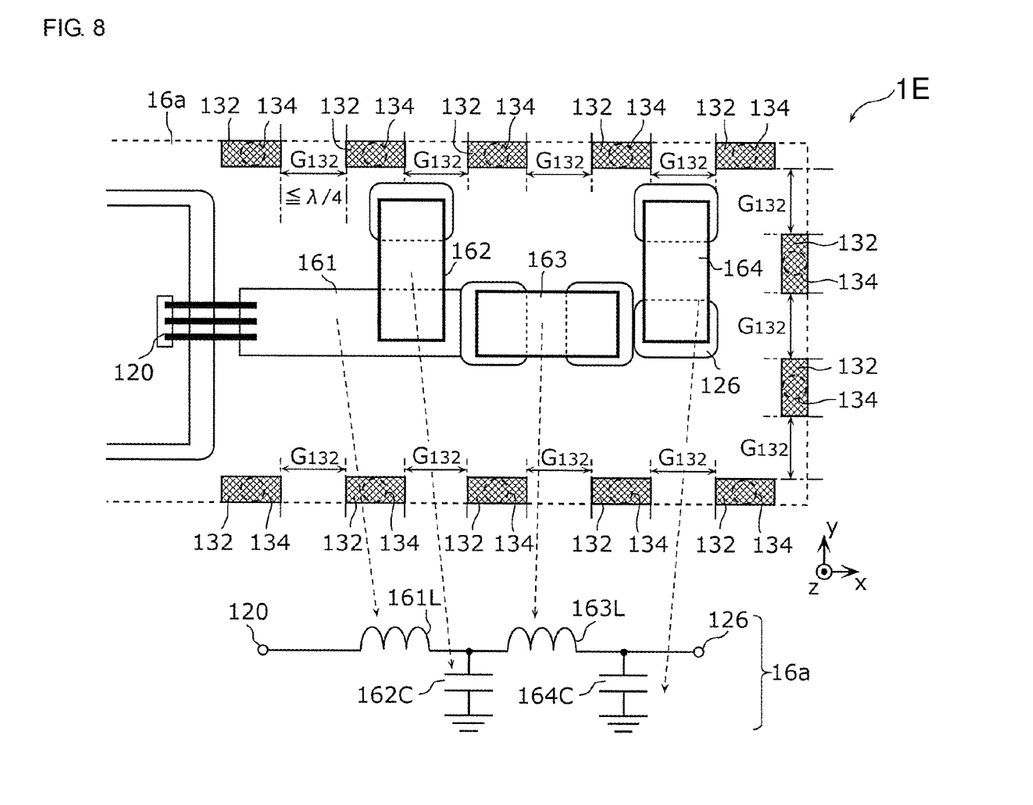
FIG. 8 is a plan structural view illustrating the vicinity of a power amplifier output unit of a high-frequency module according to a fifth variation of the first embodiment.

On the first principal face of the second substrate 102 and in a region that overlaps an output unit 16a of the power amplifier circuit 16 when the first substrate 101 and the second substrate 102 are seen in a plan view, no high-frequency circuit components are arranged. The output unit 16a of the power amplifier circuit 16 is included in the power amplifier circuit 16. A specific configuration of the output unit 16a of the power amplifier circuit 16, which is described below, is illustrated in FIG. 8.

The above-described arrangement enables it to inhibit degradation in characteristics of the high-frequency circuit components other than the power amplifier circuit 16 because of unwanted radiation from the output unit 16a of the power amplifier circuit 16 that outputs large power.

When a plurality of high-frequency amplifier circuits are arranged in the hollow portion, no high-frequency circuit components are preferably arranged in the regions that overlap respective output units of the high-frequency amplifier circuits in the plan view.

[1.4 Structure of High-Frequency Module According to Second Variation]

Figure 5:
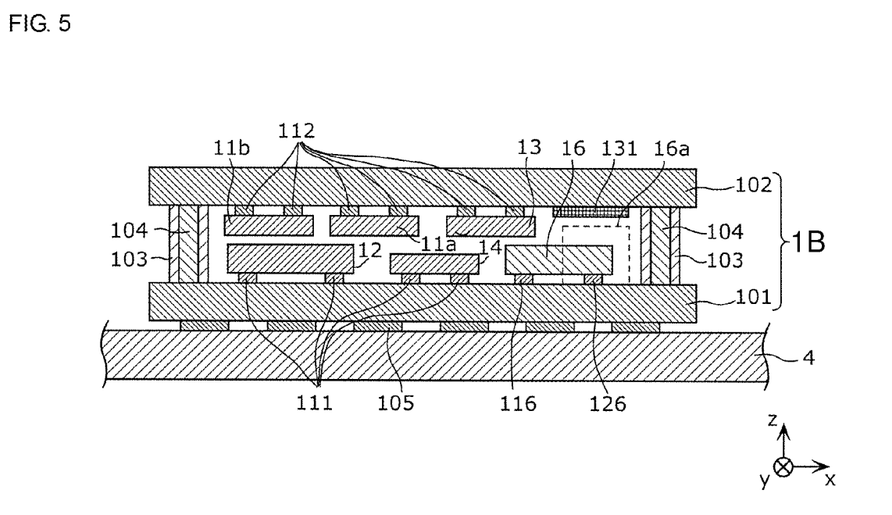
FIG. 5 is a cross-sectional structural view of a high-frequency module according to a second variation of the first embodiment.

FIG. 5 is a cross-sectional structural view of a high-frequency module 1B according to a second variation of the first embodiment. The high-frequency module 1B illustrated in FIG. 5 is different from the high-frequency module 1A according to the first variation in the configuration of members on the first principal face of the second substrate 102. Regarding the high-frequency module 1B according to the present variation, descriptions of the points common to the high-frequency module 1A are omitted and different points are mainly described below.

In the high-frequency module 1B, similar to the high-frequency module 1A, on the first principal face of the second substrate 102 and in a region that overlaps the output unit 16a of the power amplifier circuit 16 when the first substrate 101 and the second substrate 102 are seen in a plan view, no high-frequency circuit components are arranged.

The high-frequency module 1B further includes a conductor layer 131, which is arranged on the first principal face of the second substrate 102 and in the region that overlaps the output unit 16a of the power amplifier circuit 16.

The above-described arrangement enables it to inhibit the effect of unwanted radiation from the output unit 16a of the power amplifier circuit 16 on the opposite substrate.

The conductor layer 131 is preferably made from a material identical to that of the electrode wiring patterns that constitute the wiring structure of the first substrate 101 or the second substrate 102.

Thus, the conductor layer 131 and the electrode wiring patterns of a substrate can be formed in an identical process and as a result, simplification of manufacturing processes and reduction in costs are enabled.

When a plurality of high-frequency amplifier elements are arranged in the hollow portion, the conductor layer 131 is preferably arranged in each of regions that overlap respective output units of the high-frequency amplifier elements in the plan view.

[1.5 Structure of High-Frequency Module According to Third Variation]

Figure 6:
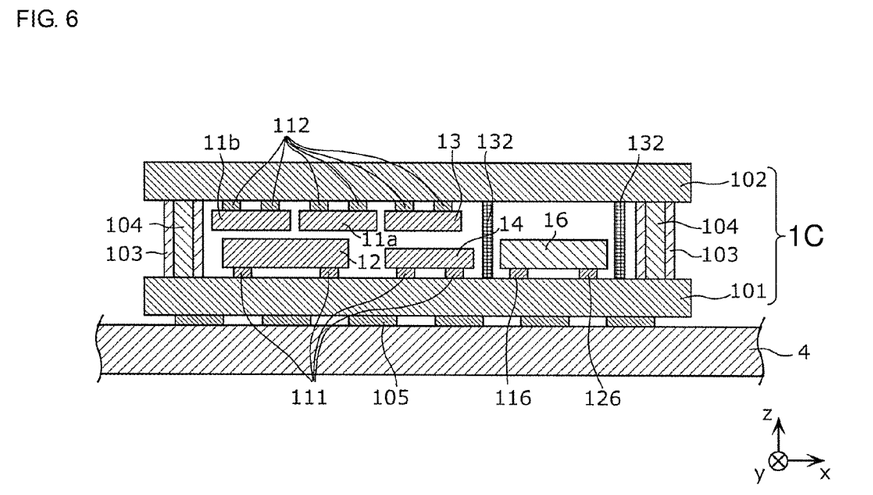
FIG. 6 is a cross-sectional structural view of a high-frequency module according to a third variation of the first embodiment.

FIG. 6 is a cross-sectional structural view of a high-frequency module 1C according to a third variation of the first embodiment. The high-frequency module 1C illustrated in FIG. 6 is different from the high-frequency module 1A according to the first variation in the configuration of peripheral members of the power amplifier circuit 16. Regarding the high-frequency module 1C according to the present variation, descriptions of the points common to the high-frequency module 1A are omitted and different points are mainly described below.

In the high-frequency module 1C, similar to the high-frequency module 1A, on the first principal face of the second substrate 102 and in a region that overlaps the output unit 16a of the power amplifier circuit 16 when the first substrate 101 and the second substrate 102 are seen in a plan view, no high-frequency circuit components are arranged.

The high-frequency module 1C further includes a conductor member 132, which is in contact with the first principal face of the first substrate 101 and the first principal face of the second substrate 102 and when the first substrate 101 and the second substrate 102 are seen in a plan view, is arranged between the power amplifier circuit 16 and a high-frequency circuit component adjacent to the power amplifier circuit 16. In the present variation, the conductor member 132 is arranged between the power amplifier circuit 16 and the transmission-side filter 14. As in the present variation, the conductor member 132 may be arranged between the power amplifier circuit 16 and the support 103. Since a circuit component that receives an output signal of a high-frequency amplifier element as an input, such as a filter or a duplexer, or a high-frequency circuit component that includes a transmission line causes strong unwanted radiation, this arrangement serves to prevent the unwanted radiation from decreasing the performance of the other high-frequency circuit components present in the internal space. The conductor member 132 is a metal plate for example.

In the above-described configuration, the conductor member 132 is arranged in the hollow portion while being in contact with the first substrate 101 and the second substrate 102 and accordingly, has a function as reinforcement for ensuring the hollow portion. Consequently, the hollow structure is unlikely to be broken. In addition, arranging the conductor member 132 between a high-frequency amplifier element and another high-frequency circuit component can prevent diffusion of unwanted radiation in a lateral direction.

The conductor member 132 may be one of electrode terminals of a high-frequency circuit component different from the above-described high-frequency amplifier element. For example, a ground electrode terminal of a high-frequency circuit component arranged in the hollow portion is caused to double as the conductor member 132. Thus, extra arrangement of the conductor member 132 is unnecessary and as a result, downsizing is enabled while preventing diffusion of unwanted radiation in a lateral direction.

[1.6 Structure of High-Frequency Module According to Fourth Variation]

Figure 7:
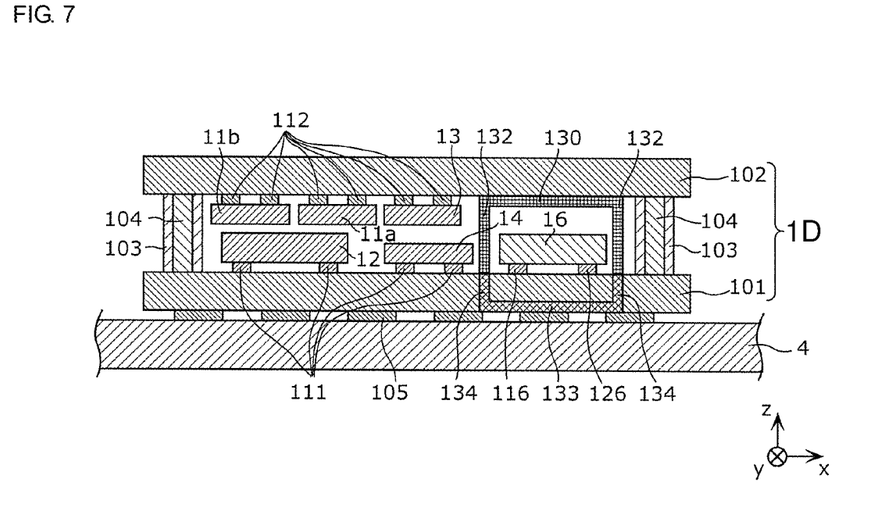
FIG. 7 is a cross-sectional structural view of a high-frequency module according to a fourth variation of the first embodiment.

FIG. 7 is a cross-sectional structural view of a high-frequency module 1D according to a fourth variation of the first embodiment. The high-frequency module 1D illustrated in FIG. 7 is different from the high-frequency module 1A according to the first variation in the configuration of peripheral members of the power amplifier circuit 16. Regarding the high-frequency module 1D according to the present variation, descriptions of the points common to the high-frequency module 1A are omitted and different points are mainly described below.

In the high-frequency module 1D, similar to the high-frequency module 1A, on the first principal face of the second substrate 102 and in a region that overlaps the output unit 16a of the power amplifier circuit 16 when the first substrate 101 and the second substrate 102 are seen in a plan view, no high-frequency circuit components are arranged.

Further, in the high-frequency module 1D according to the present variation, when the first substrate 101 and the second substrate 102 are seen in a cross-sectional view, an electric conductor including the conductor member 132 according to the third variation has a surrounding structure and is coupled to the ground.

More specifically, as illustrated in FIG. 7, the electric conductor is constituted of conductor layers 130 and 133, the conductor members 132, and the via hole electrodes 134. In the electric conductor, the conductor layers 130 and 133, the conductor members 132, and the via hole electrodes are electrically coupled and the via hole electrodes 134 are coupled to a ground electrode of the mounting board 4 with the electrode wiring pattern 105 interposed therebetween.

The conductor member 132 is arranged between the power amplifier circuit 16 and a high-frequency circuit component adjacent to the power amplifier circuit 16. The conductor layer 130 is arranged on the first principal face of the second substrate 102 and in a region that overlaps the power amplifier circuit 16. The conductor layer 133 is arranged on the second principal face of the first substrate 101 and in a region that overlaps the power amplifier circuit 16. The via hole electrode 134 is a coupling conductor that electrically couples the conductor member 132 and the conductor layer 133 and is formed in the first substrate 101. Examples of materials of the conductor layers 130 and 133, the conductor member 132, and the via hole electrode 134 include metal, such as gold, copper, or an alloy thereof.

Thus, the power amplifier circuit 16 is surrounded by the electric conductor and accordingly, diffusion of unwanted radiation from the power amplifier circuit 16 can be prevented. In addition, since the electric conductor is coupled to the ground, the unwanted radiation can be released to the outside of the high-frequency module 1D. Moreover, entry of unwanted radiation from the outside can be prevented.

[1.7 Structure of High-Frequency Module According to Fifth Variation]

The conductor member 132 according to the fourth variation does not need to be a member that connects the first substrate 101 and the second substrate 102 and is continuous along the outer edge of the power amplifier circuit 16.

FIG. 8 is a plan structural view illustrating the vicinity of a power amplifier output unit of a high-frequency module 1E according to a fifth variation of the first embodiment. The high-frequency module 1E illustrated in FIG. 8 is different from the high-frequency module 1D according to the fourth variation in the configuration of the conductor member 132. In FIG. 8, a specific circuit configuration of the output unit 16a of the power amplifier circuit 16 is depicted. Regarding the high-frequency module 1E according to the present variation, descriptions of the points common to the high-frequency module 1D are omitted and different points are mainly described below.

In FIG. 8, the configuration of members in the vicinity of the output unit 16a of the power amplifier circuit 16 on the first principal face of the first substrate 101 is depicted. As illustrated in the lower part of FIG. 8, the output unit 16a constitutes an impedance matching circuit made up of a wire connection terminal 120, inductors 161L and 163L, capacitors 162C and 164C, and an electrode wiring pattern (an output terminal) 126. In the output unit 16a, the inductors 161L and 163L are coupled in series between the wire connection terminal 120 and the electrode wiring pattern 126, and the capacitor 162C is coupled to the coupling point of the inductors 161L and 163L and to a ground terminal, and the capacitor 164C is coupled to the electrode wiring pattern 126 and a ground terminal. The coupling configuration of the output unit 16a enables impedance matching between the power amplifier circuit 16 and the transmission-side filter 14 coupled at a subsequent stage.

As illustrated in FIG. 8, a line pattern 161 formed on the first substrate 101 constitutes the inductor 161L and a chip-like inductance element 163 constitutes the inductor 163L. Chip-like capacitor elements 162 and 164 constitute the capacitors 162C and 164C, respectively. The main body of the power amplifier circuit 16 and the line pattern 161 are electrically coupled by a bonding wire.

The plurality of conductor members 132 are arranged between the power amplifier circuit 16 and a high-frequency circuit component adjacent to the power amplifier circuit 16. Each of the plurality of conductor members 132 is coupled to the first substrate 101 and the second substrate 102 and is electrically coupled to the via hole electrode 134 formed in the first substrate 101. The plurality of conductor members 132 are arranged at predetermined intervals along the power amplifier circuit 16 when the first substrate 101 and the second substrate 102 are seen in a plan view. The predetermined interval is preferably less than or equal to $\lambda/4$, where $\lambda$ represents the wave length of a high-frequency signal output from the power amplifier circuit 16.

Thus, electromagnetic radiation from the power amplifier circuit 16 can be completely confined and entry of unwanted radiation from the outside can also be inhibited.

With downsizing, reduction in thickness, and greater functionality of a communication terminal, high-density implementation of a high-frequency circuit component and a module has been demanded. In particular, since a power amplifier amplifies a high-frequency transmission signal and outputs a high-frequency signal of large power, mutual effect between a power amplifier output unit and other wiring and components increases and concern about degradation in their characteristics grows. Thus, a structure that causes no degradation in characteristics while enabling reduction in profile is demanded.

Since in each high-frequency module according to the above-described embodiment and the first to fifth variations thereof, the power amplifier that outputs large power is arranged in the hollow portion, the power amplifier can be protected from unwanted radiation that enters from the outside. Further, entry of unwanted radiation from the power amplifier into a circuit component and wiring close to the front end portion can be inhibited.

Second Embodiment

A second embodiment describes a high-frequency module having a configuration in which an amplifier module with the high-frequency amplifier elements according to the first embodiment are coupled at a plurality of stages is arranged in a hollow portion together with the other high-frequency circuit components.

A low noise power amplifier (LNPA) module, hereinafter referred to as a power amplifier module, has been proposed, where an inter-stage filter circuit is arranged between two power amplifier elements multistage-coupled so as to perform filtering on noise of a transmission signal. An LNPA module needs to include an inter-stage filter circuit between two power amplifier elements and for downsizing and reduction in profile, a configuration for implementation with increased density is desired.

[2.1 Circuit Configuration of Power Amplifier Circuit]

Figure 9A:
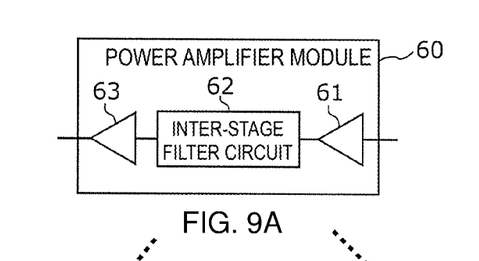
FIGS. 9A, 9B and 9C illustrate examples of a circuit configuration of a power amplifier module according to a second embodiment.

FIGS. 9A, 9B and 9C illustrate examples of a circuit configuration of a power amplifier module according to the second embodiment. As illustrated in FIG. 9A, a power amplifier module 60 according to the present embodiment includes two amplifier elements 61 and 63 and an inter-stage filter circuit 62. The inter-stage filter circuit 62 is arranged between the two amplifier elements 61 and 63 coupled in series.

Figure 9B:
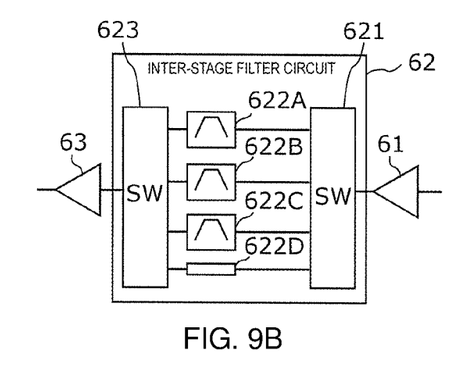
Figure 9C:
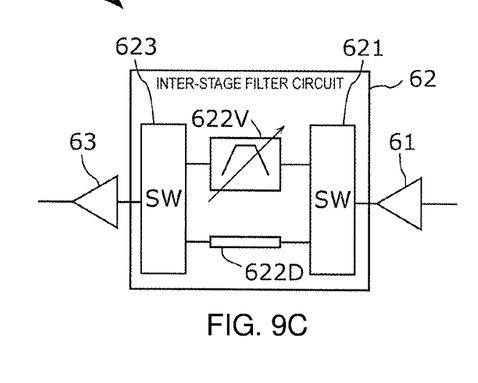

As illustrated in FIG. 9B, the inter-stage filter circuit 62 includes, for example, filters 622A, 622B, and 622C, which allow a predetermined transmission frequency band to pass and attenuate a frequency band other than the predetermined transmission frequency band, a bypass circuit 622D, which has no filtering function, and switches 621 and 623, which select one from the filters 622A to 622C and the bypass circuit 622D. The numbers of the filters 622A to 622C and the bypass circuit 622D are decided according to a demanded system. The bypass circuit 622D may be an inductor, a capacitor, or an impedance matching circuit that includes both of an inductor and a capacitor, or may be a mere transmission line. As illustrated in FIG. 9C, the filters 622A to 622C may be a variable filter 622V. In this case, filter characteristics of the variable filter 622V may be controlled by an IC. Examples of a configuration of the variable filter 622V include a form in which variable reactance circuits, such as a variable inductor and a variable capacitor, are coupled to a fixed filter. The number of the variable filters 622V may be any number.

For control of the inter-stage filter circuit 62 having the above-described configuration, an IC that has a function of determining a frequency band used and then switching the switches 621 and 623 is used.

The configuration of the power amplifier module 60 can relax characteristics of a filter or an antenna switch arranged at a subsequent stage of the RF signal processing circuit 17 and the power amplifier module 60 while enabling a circuit where increase in area is inhibited to a minimum.

[2.2 Structure of High-Frequency Module According to Second Embodiment]

Figure 10:
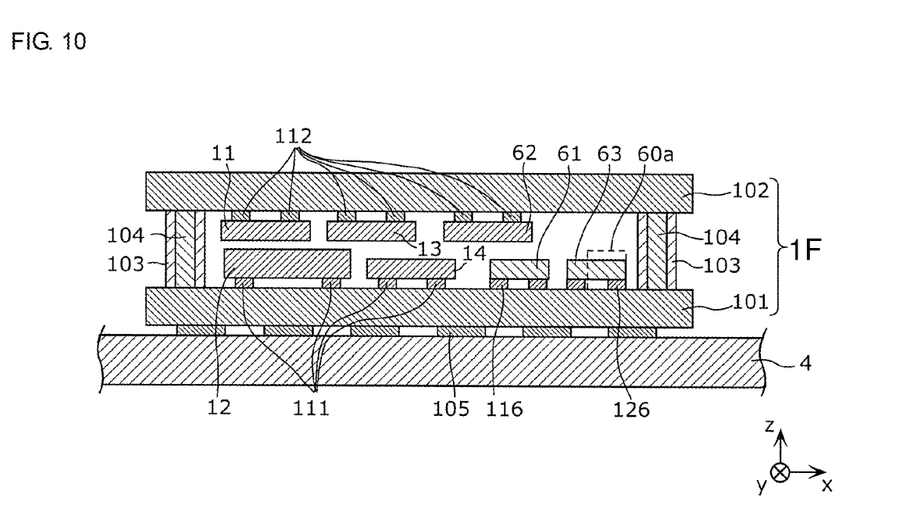
FIG. 10 is a cross-sectional structural view of a high-frequency module according to the second embodiment.

A structure of a high-frequency module 1F according to the present embodiment is described by referring to FIG. 10.

FIG. 10 is a cross-sectional structural view of the high-frequency module 1F according to the second embodiment. In FIG. 10, a cross-sectional structure of the high-frequency module 1F in a state where the high-frequency module 1F is mounted on a mounting board 4 is depicted. FIG. 10 is a III-III cross-sectional view of the high-frequency module in FIG. 2.

The high-frequency module 1F according to the present embodiment is different from the high-frequency module 1A according to the first variation of the first embodiment in the arrangement of the high-frequency amplifier elements arranged in the hollow portion. Regarding the high-frequency module 1F according to the present variation, descriptions of the points common to the high-frequency module 1A are omitted and different points are mainly described below.

The high-frequency module 1F according to the present embodiment includes a first substrate 101, a second substrate 102, a support 103, a variable matching circuit 11, an antenna switch 12, a reception-side filter 13, a transmission-side filter 14, the amplifier elements 61 and 63, and the inter-stage filter circuit 62. The amplifier elements 61 and 63, and the inter-stage filter circuit 62 constitute the power amplifier module 60.

The variable matching circuit 11, the antenna switch 12, the reception-side filter 13, the transmission-side filter 14, the amplifier elements 61 and 63, and the inter-stage filter circuit 62 are arranged in a hollow portion formed by the first substrate 101, the second substrate 102, and the support 103 and on one of a first principal face of the first substrate 101 and a first principal face of the second substrate 102. More specifically, the antenna switch 12, the transmission-side filter 14, and the amplifier elements 61 and 63 are arranged on the first principal face of the first substrate 101. The variable matching circuit 11, the reception-side filter 13, and the inter-stage filter circuit 62 are arranged on the first principal face of the second substrate 102. An input terminal of the amplifier element 61 is coupled to an electrode wiring pattern 116 and an output terminal of the amplifier element 61 is coupled to the inter-stage filter circuit 62 with a columnar electrode 104 interposed therebetween. An input terminal of the amplifier element 63 is coupled to the inter-stage filter circuit 62 with the columnar electrode 104 interposed therebetween and an output terminal of the amplifier element 63 is coupled to an electrode wiring pattern 126.

In the structure of the high-frequency module 1F, the plurality of high-frequency circuit components are separately arranged on the first substrate 101 and the second substrate 102 in a lamination relation. The plurality of high-frequency circuit components arranged on the two substrates are arranged in a single continuous internal space without being divided by a package member. Consequently, a front end portion can be downsized and reduced in profile. In addition, since the amplifier elements 61 and 63, which have the largest effect on noise performance of a high-frequency signal, are arranged in the internal space surrounded by the first substrate 101, the second substrate 102, and the support 103, the protection from unwanted radiation that enters from the outside is enabled. As a result, the high-frequency module 1 downsized and reduced in profile while ensuring performance of the high-frequency circuit components that constitute the front end portion can be provided.

At least one of the plurality of high-frequency circuit components is arranged on each of the first principal face of the first substrate 101 and the first principal face of the second substrate 102. On the first principal face of the first substrate 101, the amplifier elements 61 and 63 that are high-frequency amplifier elements are arranged. On the first principal face of the second substrate 102, the inter-stage filter circuit 62 is arranged. Thus, a distance between a power amplifier element and the inter-stage filter circuit 62 can be ensured and as a result, entry of unwanted electromagnetic radiation of the amplifier elements 61 and 63 into the inter-stage filter circuit 62 can be inhibited. The amplifier elements 61 and 63 and the inter-stage filter circuit 62 are laminated in a direction perpendicular to the substrates. Consequently, degradation in characteristics can be prevented while downsizing and reducing the profile of the power amplifier module 60.

On the first principal face of the second substrate 102 and in a region that overlaps an output unit 60a of the amplifier element 63 when the first substrate 101 and the second substrate 102 are seen in a plan view, no high-frequency circuit components are arranged.

The above-described arrangement enables it to inhibit degradation in characteristics of the high-frequency circuit components other than the amplifier element 63 because of unwanted radiation from the output unit 60a of the amplifier element 63 that outputs large power.

(Other Variations, etc.)

Although the high-frequency modules according to embodiments of the present disclosure are described above by taking the embodiments and variations, the high-frequency module of the present disclosure is not limited to the above-described embodiments and variations. Other embodiments achieved by combining given constituent elements in the above-described embodiments and variations, or variations obtained by adding various changes that a person skilled in the art can conceive to the above-described embodiments and variations within the scope not departing from the spirit of the present disclosure, and various apparatuses in which the high-frequency module of the present disclosure is installed are also included in the present disclosure.

For example, the configurations according to the first to fifth variations of the first embodiment may be applied to the amplifier elements 61 and 63 according to the second embodiment.

In the high-frequency modules according to the above-described embodiments and variations, other high-frequency circuit elements, wiring, and the like may be inserted among the circuit elements and paths that couple signal paths disclosed in the drawings.

The inter-stage filter circuit 62 may be a filter circuit that attenuates a reception frequency band. With such a configuration, when transmission signal components amplified by the amplifier element 61 include a signal in a reception frequency band, the signal in the reception frequency band can be attenuated through the inter-stage filter circuit 62 and a transmission signal can be prevented from sneaking to a reception circuit. The inter-stage filter circuit 62 may be a variable filter.

The inter-stage filter circuit 62 may be a filter circuit that attenuates a frequency band of a TV idle channel other than the channel being used among TV idle channels, or/and IMD noise. With such a configuration, the frequency of a channel adjacent to the channel used can be attenuated in a system that utilizes an idle channel in TV channels for another communication and thus, an idle channel in TV channels can be effectively utilized.

The present disclosure can be widely utilized for communication equipment, such as cellular phones, as a multimode/multiband-compatible high-frequency module arranged in a front end portion.

1, 1A, 1B, 1C, 1D, 1E, 1F High-frequency module
2 Antenna element
4 Mounting board
11 Variable matching circuit
11a, 11b Variable matching element
12 Antenna switch
13 Reception-side filter
14 Transmission-side filter
15 Low noise amplifier circuit
16 Power amplifier circuit
16a, 60a Output unit
17 RF signal processing circuit
31 Base band signal processing circuit
32 Display unit
60 Power amplifier module
61, 63 Amplifier element
62 Inter-stage filter circuit
101 First substrate
102 Second substrate
103 Support
104 Columnar electrode
105, 111, 112, 116, 126 Electrode wiring pattern
120 Wire connection terminal
130, 131, 133 Conductor layer
132 Conductor member
134 Via hole electrode
161 Line pattern
161L, 163L Inductor
162, 164 Capacitor element
162C, 164C Capacitor
163 Inductance element
621, 623 Switch
622A, 622B, 622C Filter
622D Bypass circuit
622V Variable filter

The invention claimed is:

1. A high-frequency module comprising:
   a first substrate;
   a second substrate facing the first substrate;
   a support supporting the first substrate and the second substrate;
   a plurality of high-frequency circuit components arranged in an internal space provided by the first substrate, the second substrate and the support, and on both of an uppermost surface of the first substrate and a lowermost surface of the second substrate facing the uppermost surface of the first substrate, the plurality of high-frequency circuit components including a high-frequency amplifier element constituting a high-frequency amplifier circuit; and
   a conductor member being arranged between the high-frequency amplifier circuit and a high-frequency circuit component adjacent to the high-frequency amplifier circuit when the first substrate and the second substrate are viewed in a direction perpendicular to the uppermost surface of the first substrate,
   wherein the conductor member comprises an upper member, a lower member, a right member, and a left member when viewed in a direction parallel to the uppermost surface of the first substrate, an entire uppermost surface of the upper member of the conductor member is in direct contact with the lowermost surface of the second substrate, an entire lowermost surface of the lower member of the conductor member is coplaner with a lowermost surface the first substrate,
   an entire inner surface of the right member of the conductor member is parallel to an entire inner surface of the left member of the conductor member when viewed in the direction parallel to the uppermost surface of the first substrate,
   the high-frequency amplifier circuit is completely surrounded by the conductor member when the first substrate and the second substrate are viewed in the direction parallel to the uppermost surface of the first substrate, and
   the conductor member is coupled to a ground.

2. The high-frequency module according to claim 1, wherein
   on one of the uppermost surface of the first substrate and the lowermost surface of the second substrate facing another substrate on which the high-frequency amplifier circuit is arranged and in a region overlapping with the high-frequency amplifier circuit when the first substrate and the second substrate are viewed in a direction perpendicular to the uppermost surface of the first substrate, none of the plurality of high-frequency circuit components is arranged.

3. The high-frequency module according to claim 2, wherein in a region overlapping with an output unit of the high-frequency amplifier circuit when the first substrate and the second substrate are viewed in a direction perpendicular to the uppermost surface of the first substrate, none of the plurality of high-frequency circuit components is arranged.

4. The high-frequency module according to claim 3, further comprising
a conductor layer arranged on one of the uppermost surface of the first substrate and the uppermost surface of the second substrate facing another substrate on which the high-frequency amplifier circuit is arranged and in a region overlapping with the output unit of the high-frequency amplifier circuit when viewed in a direction perpendicular to the uppermost surface of the first substrate.

5. The high-frequency module according to claim 4, wherein
a principal ingredient of the conductor layer is a material same as a material of a wiring layer constituting a wiring structure of the first substrate or the second substrate.

6. The high-frequency module according to claim 5, further comprising
a conductor member being in contact with the uppermost surface of the first substrate and the lowermost surface of the second substrate and arranged between the high-frequency amplifier circuit and a high-frequency circuit component adjacent to the high-frequency amplifier circuit when the first substrate and the second substrate are viewed in a direction perpendicular to the uppermost surface of the first substrate.

7. The high-frequency module according to claim 4, further comprising
a conductor member being in contact with the uppermost surface of the first substrate and the lowermost surface of the second substrate and arranged between the high-frequency amplifier circuit and a high-frequency circuit component adjacent to the high-frequency amplifier circuit when the first substrate and the second substrate are viewed in a direction perpendicular to the uppermost surface of the first substrate.

8. The high-frequency module according to claim 3, further comprising
a conductor member being in contact with the uppermost surface of the first substrate and the lowermost surface of the second substrate and arranged between the high-frequency amplifier circuit and a high-frequency circuit component adjacent to the high-frequency amplifier circuit when the first substrate and the second substrate are viewed in a direction perpendicular to the uppermost surface of the first substrate.

9. The high-frequency module according to claim 2, further comprising
a conductor member being in contact with the uppermost surface of the first substrate and the lowermost surface of the second substrate and arranged between the high-frequency amplifier circuit and a high-frequency circuit component adjacent to the high-frequency amplifier circuit when the first substrate and the second substrate are viewed in a direction perpendicular to the uppermost surface of the first substrate.

10. The high-frequency module according to claim 1, wherein
the conductor member includes the plurality of high-frequency circuit components.

11. The high-frequency module according to claim 10, wherein
a plurality of the conductor members are arranged at predetermined intervals along an outer edge of the high-frequency amplifier circuit in the plan view, and
the predetermined interval is less than or equal to $\lambda/4$, where $\lambda$ represents a wave length of a high-frequency signal output from the high-frequency amplifier circuit.

12. The high-frequency module according to claim 10, wherein
the high-frequency amplifier circuit is surrounded by an electric conductor including the conductor member when the first substrate and the second substrate are viewed in a direction parallel to the uppermost surface of the first substrate, and
the electric conductor is coupled to a ground.

13. The high-frequency module according to claim 1, wherein
a plurality of the conductor members are arranged at predetermined intervals along an outer edge of the high-frequency amplifier circuit in the plan view, and
the predetermined interval is less than or equal to $\lambda/4$, where $\lambda$ represents a wave length of a high-frequency signal output from the high-frequency amplifier circuit.

14. The high-frequency module according to claim 1, wherein
the plurality of high-frequency circuit components include a high-frequency amplifier module constituted of a plurality of the high-frequency amplifier elements and an inter-stage filter circuit arranged on a coupling path of the plurality of high-frequency amplifier elements.

15. The high-frequency module according to claim 14, wherein
the plurality of high-frequency amplifier elements are all arranged on one of the uppermost surface of the first substrate and the lowermost surface of the second substrate, and
the inter-stage filter circuit is arranged on another one of the uppermost surface of the first substrate and the lowermost surface of the second substrate.

16. The high-frequency module according to claim 14, wherein
the inter-stage filter circuit is a filter circuit attenuating a reception frequency band.

17. The high-frequency module according to claim 14, wherein
the inter-stage filter circuit is a filter circuit attenuating a frequency band of a TV idle channel other than a channel being used among TV idle channels, or/and IMD noise.

18. The high-frequency module according to claim 1, wherein
the high-frequency amplifier element is a power amplifier amplifying a transmission wave.

19. The high-frequency module according to claim 1, wherein the right member comprises a first conductor member and a first via hole electrode, and the left member comprises a second conductor member and a second via hole electrode.

* * * * *